(12) United States Patent
Gelbart

(10) Patent No.: US 6,214,276 B1
(45) Date of Patent: Apr. 10, 2001

(54) METHOD OF FORMING OBJECTS FROM THERMOSENSITIVE COMPOSITION

(75) Inventor: Daniel Gelbart, Vancouver (CA)

(73) Assignee: Creo SRL, St. James (BB)

( * ) Notice: Subject to any disclaimer, the term of this patent is extended or adjusted under 35 U.S.C. 154(b) by 0 days.

(21) Appl. No.: 09/317,076

(22) Filed: May 18, 1999

(51) Int. Cl.[7] .......................... B29C 35/08; B29C 41/02; B29C 41/22
(52) U.S. Cl. ............................................ 264/401; 264/259
(58) Field of Search .................................. 264/259, 308, 264/401

(56) References Cited

U.S. PATENT DOCUMENTS 4,929,402 * 5/1990 Hull ...................................... 264/401

OTHER PUBLICATIONS

Huang, J. et al. "Thermal Imaging: Application in Offset Printing Plate Making", IS & T NIP Fourth International Conference, 1998.*

* cited by examiner

Primary Examiner—Leo B. Tentoni
(74) Attorney, Agent, or Firm—Oyen Wiggs Green & Mutala

(57) ABSTRACT

Three dimensional objects are formed by scanning a liquid thermosensitive resin with a laser beam causing imagewise heating of the resin. Because thermosensitive compositions do not obey the law of linear superposition, the problem of stray exposure is eliminated allowing the thermal polymerization of any point within the volume of the liquid without affecting adjacent points.

24 Claims, 2 Drawing Sheets

METHOD OF FORMING OBJECTS FROM THERMOSENSITIVE COMPOSITION

FIELD OF THE INVENTION

The invention relates to the generation of three-dimensional objects by imaging, a field also known as stereolithography, and in particular to thermal stereolithography of various objects, including flexographic printing plates.

BACKGROUND OF THE INVENTION

The generation of three dimensional (3D) objects by imaging a liquid resin is well known and has been commercially available for many years. Typically the liquid resin is made to polymerize in areas exposed to intense UV light from a laser or a mask illuminated by a UV lamp. The two best known applications are building 3D models by a process known as stereolithography and manufacturing flexographic printing plates. Flexographic printing plates are printing plates having considerable surface relief previous methods for creating a 3D object by imaging a liquid resin use a photonic principle, Such processes fall under what is known as the "Law of Reciprocity". This law states that imaging a long time using a low intensity light or imaging a short time using a high intensity light will give the same result, as long as the exposure (defined as the integral of the light intensity over time) stays the same. A different way to state this behaviour is to say that the exposure process falls under the law of linear superposition. The law of linear superposition states that: $f(a+b)=f(a)+f(b)$. Simply stated, the result of the combined exposure of (a+b) is the same as exposure by "a" followed by exposure "b".

Because of this behaviour, it is not possible to focus the exposure deep inside the liquid without exposing the volume above the desired exposure point. This is shown in FIG. 1, which shows the prior art. When beam 3 is focussed by lens 4 to a point 5 inside liquid resin 1, in order to polymerize it, the area above point 5 will undergo polymerization as well. As point 5 moves along a line inside the liquid resin in the immediate vicinity of the line along which point 5 moves the resin is subject to intense exposure for a short time. The volume 6 above the line through which the exposing light passes before reaching point 5 is subjected to a weak exposure for a long time (due to the large overlap of the beams forming point 5). Since the product of intensity and exposure is about the same in volume 6 as it is along line 5, volume 6 will polymerize as well. If the absorbance of material 1 is high, volume 6 will actually receive a higher exposure than the desired area along the line travelled by point 5 as point 5 is scanned to cover a large area. A volume deeper in the fluid 1 than point 5 will be exposed as well, however, with a lower exposure due to part of the light being absorbed. For these reasons, prior art systems can only expose the top layer of a liquid polymer and require elaborate means to lower the polymerized layer and keep it submerged, in order to build an object layer-by-layer, always exposing only the top layer. There are some polymerization processes which deviate from the "Law of Reciprocity" such as two-photon absorption processes, in which the rate is proportional to the square of the intensity. Such processes still integrate light and suffer from very low sensitivity requiring high amounts of UV light.

Recently, a new class of materials known as thermosensitive, or thermal, materials has become available. Their main use is the generation of planographic two dimensional offset printing plates, also known as lithographic plates. Thermosensitive materials polymerize upon reaching a critical threshold temperature and have insignificant polymerization at temperatures below the threshold. Because of this property they operate completely outside the "Law of Reciprocity" or the principle of linear superposition. An example of a thermosensitive process is melting. A block of lead can be melted by heating it up to 500° C. but cannot be melted by heating it up twice to 250° C. It can be kept forever at 250° C. without any effect. This non-integrating behavior is typical of all thermosensitive materials Some prior art processes use laser heating for stereolithography by cutting thin sheets or melting a thin layer of powder. However, neither process is suitable for true 3D imaging as the material used will scatter the light; it can only be used on a thin layer. Furthermore, in these processes the material starts off as a solid and the heat turns it into a liquid or gas. In this disclosure the word "resin" should be broadly understood as any material capable of being converted from a liquid into a solid by a chemical reaction.

SUMMARY OF THE INVENTION

This invention exploits the fact that the exposure of thermosensitive resins does not obey the law of superposition or the law of linear super-position. Three-dimensional objects are created inside a volume of thermosensitive liquid resin by 3D scanning of the volume using a focussed light beam, preferably in the IR part of the spectrum. The focussed light beam heats the resin to a high temperature in the immediate vicinity of the focal point. The resin polymerizes rapidly at the points the light is focussed, due to the high temperature, but heats up only slightly in all other areas. As the beam is scanned the areas where temperatures have not reached threshold cool down and do not integrate the exposure. The unexposed parts of the resin may be heated repeatedly to temperatures lower than the threshold temperature without polymerization.

The efficiency of the process can be further increased by providing multiple beams, from different directions, which are focussed on a common point. This also allows nearly constant exposure through the volume of the resin.

BRIEF DESCRIPTION OF THE DRAWINGS

FIG. 3-$b$ is a graph showing the polymerization rate of the resin as a function of temperature.

DETAILED DESCRIPTION OF THE PREFERRED EMBODIMENT

Figure 1:
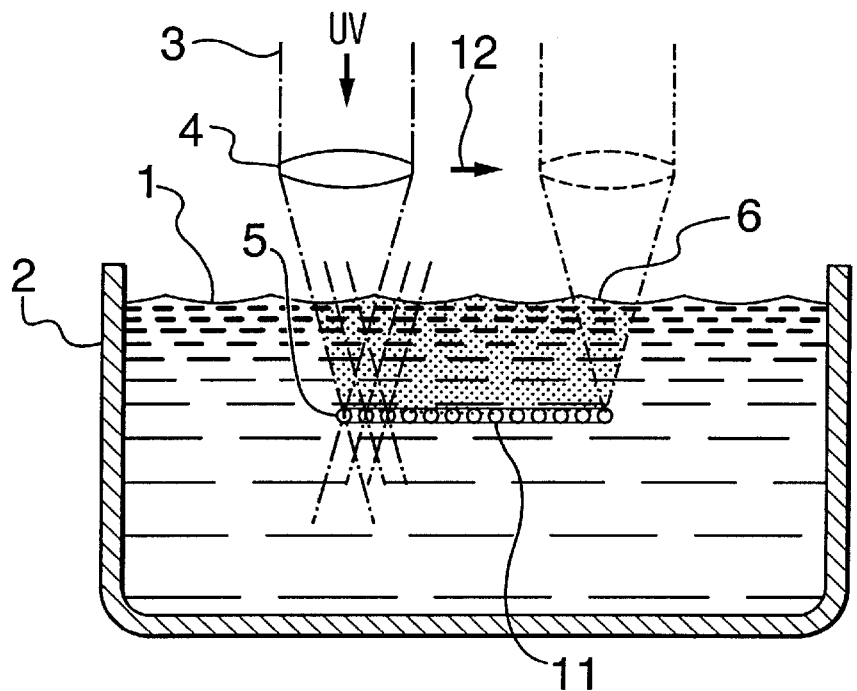
FIG. 1 is a cross-section of a prior art stereolithography apparatus illustrating the problem of exposing a layer of photosensitive resin located below the surface of the resin.
Figure 2:
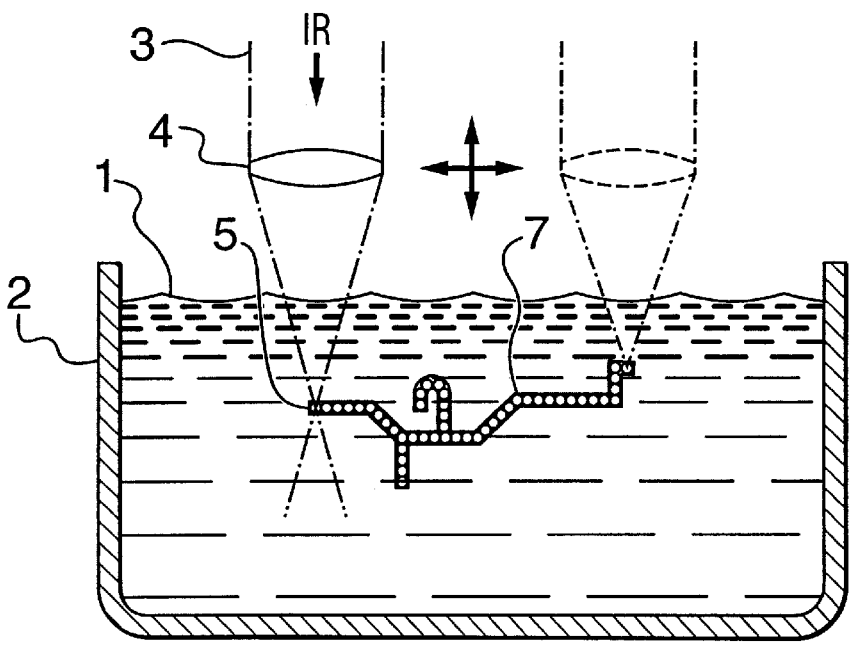
FIG. 2 is a cross-section of a stereolithography apparatus using thermosensitive resin.

Referring now to FIG. 2, a vessel is filled with a thermosensitive liquid resin 1. A laser beam 3 preferably in the IR part of the spectrum such as 800 nm to 1200 nm, is focussed to a point 5 using lens 4. Non laser sources can be used as well. Multiple points 5 can be generated simultaneously by the use of multi-channel modulators or light valves. When light valves are used they can be one or two-dimensional. The resin 1 is made to absorb the wavelength of the light used. A suitable absorbing dye can be added to the polymer to control the absorption. The thicker the resin the less dye concentration is desired, to allow the light to penetrate the resin. At the point of focus 5 the resin heats up rapidly and polymerizes (cross-links) into a solid. By scanning spot 5 through-out the volume of the polymer, a 3D object 7 is created. All areas outside the volume of object 7 do not polymerize as they did not reach the threshold temperature and cooled back down. Even if an area is scanned multiple times there is no accumulated effect.

Figure 3A:
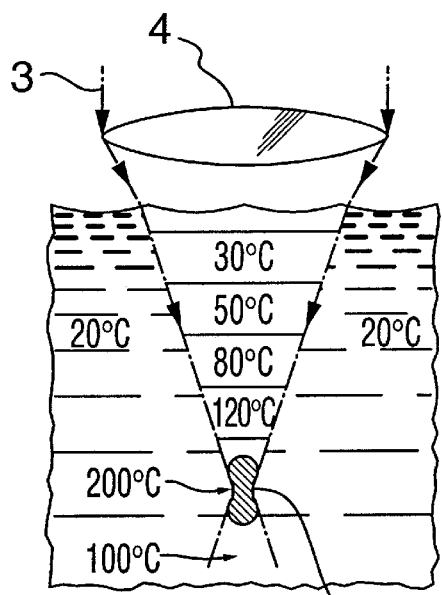
FIG. 3-$a$ shows the temperature distribution in the volume of thermosensitive resin during the exposure.
Figure 3B:
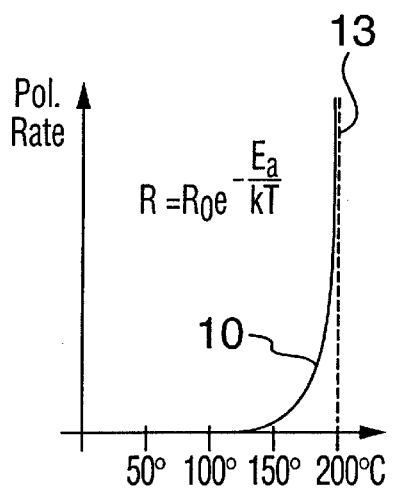

An example of a possible temperature distribution inside the resin when the laser beam 3 is focussed on a spot 5 is shown in FIG. 3-*a*. Because of the high concentration of light at point 5, only the resin in the immediate vicinity of point 5 gets sufficiently hot to polymerize. In order to produce a very localized effect the angle of the cone of light formed by lens 3 should be large, preferably in the range of 30° to 90°. This also increases the optical resolution of the system.

FIG. 3-*b* is a graph showing the polymerization rate of a possible resin as a function of temperature. In general only materials involving a physical change, such as melting, have ideal threshold behaviour as shown by line 11. Most thermosensitive resins follow the Arrhenius law and have graphs of polymerization rate as a function of temperature similar to 10. The Arrhenius law states that the rate of a chemical reaction generally follows the equation $$R = Ro e^{-\left(\frac{E_a}{kt}\right)}$$

where R=rate; Ro=rate constant; Ea=activation energy; k=Boltzmann's constant and t=temperature in degrees Kelvin. In practice, when Ea is sufficiently high, graph 10 is sufficiently close to the ideal graph 11. For most thermosensitive resins a drop in temperature of 50° C. will slow the reaction by a factor of about 30 fold, and a drop of 100° C. will slow the reaction down by about 1000 fold. In order to make the resin as sensitive as possible it is desired to make the threshold temperature as low as possible (but normally above room temperature). For Arrhenius type resins this conflicts with the desire to use a resin which has a long shelf life. This problem can be solved by mixing together two components, such as a base resin and a catalyst, just before use.

Many existing two-component adhesives and casting resins such as epoxies, polyurethane, polyesters and silicone rubber resins can be used as thermosensitive resins. If the amount of catalyst is low the curing time is slow without heating. By adding an absorber dye and selectively heating with a laser, curing (polymerization) will only occur at points on which the beam is focussed. Another family of thermosensitive resins is based on Thermal Acid Generators, in which the high temperature generates an acid, which serves as a catalyst for polymerization. These materials are very similar to the existing photosensitive resins which use a Photo Acid Generator. In the preferred embodiment the laser is a diode laser operating between 800 nm and 1200 nm, typically 830 nm. To get the correct absorption the resin is mixed with an IR absorber dye (available from Zeneca Ltd., U.K. and other vendors), The amount of catalyst and dye in the resin are chosen as follows;

A. After mixing with the catalyst the resin should stay liquid until the imaging is complete, in order to be able to pour away the liquid portion of the resin. This dictates using typically 1%–25% of the amount of catalyst used for normal room temperature curing. The exact amount is selected according to the longest imaging time required. More catalyst allows less time for handling and imaging but increases the sensitivity of the resin.

B. The amount of dye is selected according to the depth of the liquid polymer. Typical absorbance is between A=0.3 to A=3 for the whole thickness (i.e. total transmission between 50% and 1%). Less absorbance creates more uniform polymerization at lower sensitivity C. Many resins are exthothermic when polymerizing. This is desirable as it increases sensitivity.

D. For best results the resin, catalyst and dye should be mixed just prior to use.

E. For very thick objects it is preferred to build them up from a few thin sections, which can be fused together using the same resin as an adhesive. This allows a higher dye concentration to be used, for greater sensitivity.

Figure 4:
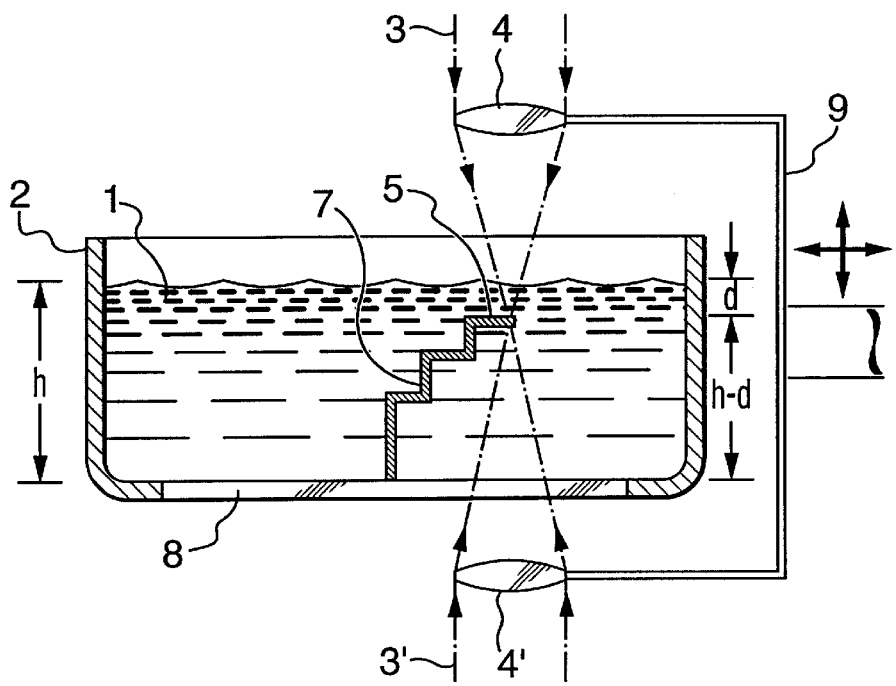
FIG. 4 shows a cross-section of stereolithography apparatus using multiple light beams to heat up a point inside the resin.

In order to achieve more uniform polymerization it is desired to focus the light from different directions. This is shown in FIG. 4. Vessel 2 has a transparent bottom 8 and two laser beams, 3 and 3', focussed by lenses 4 and 4', come to focus at the same spot 5. Spot 5 can be scanned in three dimensions within the volume of thermosensitive resin 1 to create 3D object 7. Lenses 4 and 4' are mounted on a common frame 9. All other optical components required to feed light beams 3 and 3' to the scanning lenses are not shown, as they are well known in the art of laser scanning. It should be noted that the focal point of beam 3 shifts as it enters resin 1 due to the higher refractive index of the resin, If beam 3 is passing through a resin thickness of d, its focal point 5 will shift by about d (n−1)/n, where "n" is the refractive index of resin 1. The focal point of beam 3' will shift in a similar manner by (h−d)(n−1)/n. Since the sum of the shifts is d(n−1)/n+(h−d)(n−1)/n=h(n−1)/n, which is independent of d, both beams will always stay in focus as long as the distance between lenses 4 and 4' is compensated by the amount h(n−1)/n. A similar compensation takes place in the amount of energy reaching point 5. If the total transmission of the full thickness "h" is "T", when point 5 is at the top or bottom of the vessel the amount of light is I+I×T=I (1+T), where I is the intensity of beam 3 or 3'. The lowest exposure is when point 5 is midway between top and bottom. Since the transmission of half of thickness "h" is √T (where "T" is expressed as a fraction from 0 to 1), the exposure in the middle is I√T+I√T=2I√T. In order to achieve uniform exposure, 1+T needs to be equal to 2√T. This is only possible for T=I, which means no energy absorbed (and no heating). However, for reasonable values of "T" the exposure stays nearly constant. For example, for T=0.5, I+T=1.5; 2√T=1.42, which is only about 5% less than 1.5. This shows the advantage of the configuration of FIG. 4 over FIG. 2 as light intensity will vary by 50% in FIG. 2 for T=0.5.

For better results, light intensity can be adjusted automatically. This is done by keeping the power at point 5 constant by calculating the total absorption of each beam as a function of the thickness of resin it is passing through. While the invention is not limited to any particular application, it is most useful when the object created is nearly flat, such as relief printing plates. Under these conditions the invention is more efficient as higher absorption (per unit thickness) can be used. Both letterpress (rigid) and flexographic (flexible) printing plates can be produced. While the main advantage of the invention is in the true 3D scanning of a volume of resin, the use of thermoresist has advantages even when scanning the object one layer at a time, as it allows the use of low cost and powerful diode lasers instead of expensive UV lasers. In a thermal process the wavelength of the laser is of no importance, since it is converted to heat. The ability to use low cost lasers plus the freedom from any concerns of stray light or room light is superior to prior art stereolithography even when exposing only the top layer of the resin, as done in the prior a. Sometimes it is desired to achieve partial polymerization, turning the liquid into a soft gel, before scanning is done. This allows one, for example, to form a flexographic plate by coating a dimensionally stable substrate, such as a metal or polyester sheet, with such a gel and exposing it by shaping the plate into the form of a cylinder, as a cylinder shape is easy to scan by rotating it around its axis. When flatbed scanning is used the flexographic plate can be made out of liquid resin, Scanning can be achieved by a single laser, preferably laser diode, an array of laser diodes or a light valve used to form many spots from a single laser. An additional advantage of using a gel is increased sensitivity, as the resin is already partly polymerized before the exposure commences. This disadvantage of a gel over a liquid is that the unused material cannot simply be poured off but has to be removed by washing, scrubbing, etc.

Sometimes a post-curing step is required to improve the process. Post curing steps are usually done after the unsolidified portion of the resin is discarded (or re-used). Post curing can include, but is not limited to, the following: baking (i.e. heating of the 3D object in an oven); UV exposure, washing, surface, treating, painting etc. In certain occasions a pre-curing step such as activation of the liquid material by UV exposure or heating below the threshold can be used. The words "curing" in this disclosure should be understood in a broad sense as any process causing solidification. Curing is usually achieved by cross-linking or polymerization but the invention should be interpreted broadly to include any type of solidification of a liquid or gel.

In some cases where the object is very thin and does not require much vertical resolution, a 3D object can be created by a 2D scan, using the depth-of-focus of the scanning system to create the third dimension. Thin flexographic plates can be created this way using the invention. By the way of example, a 1 mm thick plate with 0.5 mm of relief can be created at a resolution of better than 20 microns, as the depth of focus of a 830 nm laser beam when focussed to a 15 micron spot exceeds 0.5 mm. For more accurate vertical profiling a 3D scan is required; in such a case a smaller spot with lower depth of focus can be used.

What is claimed is:

1. A method for forming a three dimensional object comprising:
    (a) providing a volume of a thermosensitive resin, the resin having a rate of solidification which increases with temperature;
    (b) rapidly raising a temperature of at least one interior spot in the volume of thermosensitive resin to a temperature sufficient to cause the thermosensitive resin to solidify by focussing a beam of radiation on the spot wherein the increased temperature of the thermosensitive resin in the vicinity of the spot causes the thermosensitive resin to solidify in the vicinity of the spot;
    (c) building up a three-dimensional object by repeating the step of raising a temperature of an interior spot in the volume of thermosensitive resin for different spots; and,
    (d) removing unsolidified resin from the three-dimensional object.

2. A method as claimed in claim 1, wherein the resin is in liquid form.

3. A method as claimed in claim 1 wherein the resin is in gel form.

4. A method as claimed in claim 1 wherein the resin polymerizes upon heating.

5. A method as claimed in claim 1 wherein providing the resin comprises mixing together two or more components prior to use.

6. A method as claimed in claim 1 comprising simultaneously raising temperatures of a plurality of distinct interior spots in the volume of thermosensitive resin by the use of a light value and at least one laser diode.

7. A method as claimed in claim 1 comprising simultaneously raising temperatures of a plurality of distinct interior spots in the volume of thermosensitive resin by simultaneously concentrating radiation from one or more diodes in an array of laser diodes on each of the plurality of spots.

8. A method as in claim 1 wherein the radiation has a wavelength is in the range of 800 nm to 1100 nm.

9. A method as in claim 1 wherein the resin comprises a light-absorbing dye.

10. A method as in claim 1 wherein the object is a flexographic printing plate comprising solidified resin on a dimensionally stable substrate.

11. A method as claimed in claim 1 comprising providing the resin as a gel layer on a dimensionally stable substrate, wherein the object comprises a flexographic printing plate.

12. A method as claimed in claim 11 wherein providing the volume of thermosensitive resin comprises providing a generally cylindrical gel layer and rapidly raising a temperature of an interior spot in the volume of thermosensitive resin is performed while rotating the gel layer.

13. A method as claimed in claim 1 comprising post-curing the object.

14. A method as claimed in claim 1 wherein the object comprises a thin flexographic printing plate and said scanning is done as a two dimensional scan.

15. A method as claimed in claim 1 wherein raising the temperature of the spot comprises focussing onto the spot two beams of light from different directions.

16. The method of claim 15 wherein the two beams are collinear.

17. The method of claim 16 wherein providing the volume of resin comprises providing a volume of resin in a container having a transparent wall wherein one of the two beams enters the resin through the transparent wall.

18. The method of claim 16 wherein the two beams are focussed by an optical system comprising first and second lenses supported on a common frame and selecting different spots includes moving the frame relative to the resin.

19. The method of claim 1 wherein the volume of resin has an absorbance in the range of A=0.3 to A=3.

20. The method of claim 1 wherein rapidly raising the temperature of the at least one interior spot is carried out while maintaining a temperature of resin overlying the spot sufficiently low that the resin overlying the spot does not solidify.

21. The method of claim 1 wherein focussing the beam of radiation on the spot comprises causing the bean of radiation to converge on the spot with an angle in excess of 30 degrees.

22. A method for forming a three dimensional object comprising:
    (a) providing a volume of a thermosensitive resin having a threshold temperature wherein the resin solidifies rapidly when raised to a temperature in excess of the threshold temperature;
    (b) rapidly raising a temperature of an interior spot in the volume of thermosensitive resin to a temperature in excess of the threshold temperature by providing a beam of radiation focussed on the spot wherein the increased temperature of the thermosensitive resin in the vicinity of the spot causes the thermosensitive resin to solidify in the vicinity of the spot;

(c) building up a three-dimensional object by repeating the step of raising a temperature of an interior spot in the volume of thermosensitive resin for different spots; and, (d) removing unsolidified resin from the three-dimensional object.

23. The method of claim 22 wherein rapidly raising a temperature of an interior spot in the volume of thermosensitive resin to a temperature in excess of the threshold temperature comprises maintaining a volume of resin surrounding the interior spot at temperatures lower than the threshold temperature.

24. The method of claim 22 wherein a rate of solidification of the thermosensitive resin as a function of temperature increases sharply as the temperature of the thermosensitive resin approaches the threshold temperature.

* * * * *

UNITED STATES PATENT AND TRADEMARK OFFICE
CERTIFICATE OF CORRECTION

PATENT NO. : 6,214,276 B1
DATED : April 10, 2001
INVENTOR(S) : Daniel Gelbart

It is certified that error appears in the above-identified patent and that said Letters Patent is hereby corrected as shown below:

Column 4,
Line 47, replace "T = I" with -- T=1 --
Line 49, replace "I + T = 1.5" with -- 1 + T = 1.5 --;

Column 5,
Line 5, replace "prior a" with -- prior art --.

Signed and Sealed this

Thirtieth Day of November, 2004

JON W. DUDAS
*Director of the United States Patent and Trademark Office*